United States Patent
Benton et al.

Patent Number: 5,141,878
Date of Patent: Aug. 25, 1992

[54] SILICON PHOTODIODE FOR MONOLITHIC INTEGRATED CIRCUITS AND METHOD FOR MAKING SAME

[75] Inventors: Janet L. Benton, Warren; Renuka P. Jindal, Berkeley Heights; Ya-Hong Xie, Flemington, all of N.J.

[73] Assignee: AT&T Bell Laboratories, Murray Hill, N.J.

[21] Appl. No.: 503,193

[22] Filed: Apr. 2, 1990

[51] Int. Cl.$^5$ .............................. H01L 31/12
[52] U.S. Cl. ........................ 437/3; 437/51; 437/90; 437/905; 357/20
[58] Field of Search ............. 437/3, 904, 905; 357/20

[56] References Cited

U.S. PATENT DOCUMENTS

| | | | |
|---|---|---|---|
| 4,904,607 | 2/1990 | Riglet et al. | 437/3 |
| 4,956,304 | 9/1990 | Cockrum et al. | 437/904 |
| 4,972,244 | 11/1990 | Buffet et al. | 357/20 |
| 5,010,018 | 4/1991 | Polasko et al. | 437/904 |

FOREIGN PATENT DOCUMENTS

| | | |
|---|---|---|
| 2481519 | 10/1981 | France . |
| 241275 | 4/1986 | Japan . |
| 0067566 | 5/1982 | United Kingdom . |

OTHER PUBLICATIONS

S. Miura, et al. "A Novel Planarization Technique for Optoelectronic Integrated Circuits and Its Application to a Monolithic AlGaAs/GaAs p-i-n FET", *I.E.E.E. Transactions on Electron Devices*, vol. ED-34 (1987).

Primary Examiner—Olik Chaudhuri
Assistant Examiner—Long Pham
Attorney, Agent, or Firm—Glen E. Books

[57] ABSTRACT

An integrated photodiode is formed by providing a silicon substrate with a deep recessed tub in excess of about 20 microns, forming an isolated p-n junction on the peripheral tub surfaces, and selectively epitaxially filling the tub with intrinsic silicon. A desired monolithic integrated circuit is fabricated outside the tub periphery using conventional VLSI techniques. A photodiode electrode structure within the tub periphery can be fabricated at the same time as other monolithic circuit components are formed.

4 Claims, 3 Drawing Sheets

SILICON PHOTODIODE FOR MONOLITHIC INTEGRATED CIRCUITS AND METHOD FOR MAKING SAME

BACKGROUND OF THE INVENTION

The present invention relates to photodiodes and, more particularly, to an integrated photodiode for silicon monolithic integrated circuits.

With the rapid proliferation of fiber optic communications systems and associated opto-electronic devices, photodiodes have become increasingly important. Information in the form of optical signals is difficult to process. However photodiodes can convert optical signals to electrical signals, and the resulting electrical signals can be efficiently and reliably processed by one of the very large number of compact, complex and inexpensive processing circuits now available in monolithic integrated circuits through silicon VLSI technology.

However one difficulty that has been encountered in the marriage of optical and VLSI technology is the absence of a reliable monolithically integrated silicon photodiode. Because of silicon's low absorption characteristics, photons of interest can often penetrate to depths greater than can be readily controlled by conventional planar technology. As a consequence, free carriers photonically generated deep within the substrate can disrupt nearby integrated circuit components. In addition, nearby components must be isolated from the DC bias voltage used with the photodiode.

Because integrated photodiodes have generally been incompatible with proper functioning of the other components of a VSLI integrated circuit, most optoelectronic devices employing photodiodes and silicon monolithic integrated circuits have been hybrid structures employing separately fabricated photodiodes in conjunction with separately fabricated amplifying and processing circuits. This hybrid approach increases cost and reduces reliability and performance.

SUMMARY OF THE INVENTION

In accordance with the present invention, a silicon substrate is provided with a deep recessed tub in excess of about 20 microns, an isolating p-n junction is formed on the peripheral tub surfaces and the tub is epitaxially filled with intrinsic silicon. A desired monolithic integrated circuit is fabricated on the planarized substrate outside the tub periphery using conventional VLSI techiques. A photodiode electrode structure within the tub periphery can be fabricated at the same time as the other monolithic circuit components or separately, if desired.

BRIEF DESCRIPTION OF THE DRAWINGS

The advantages, nature and various additional features of the present invention will appear more fully upon consideration of the illustrative embodiments now to be described in detail in connection with the accompanying drawings, in which.

DETAILED DESCRIPTION

Figure 1:
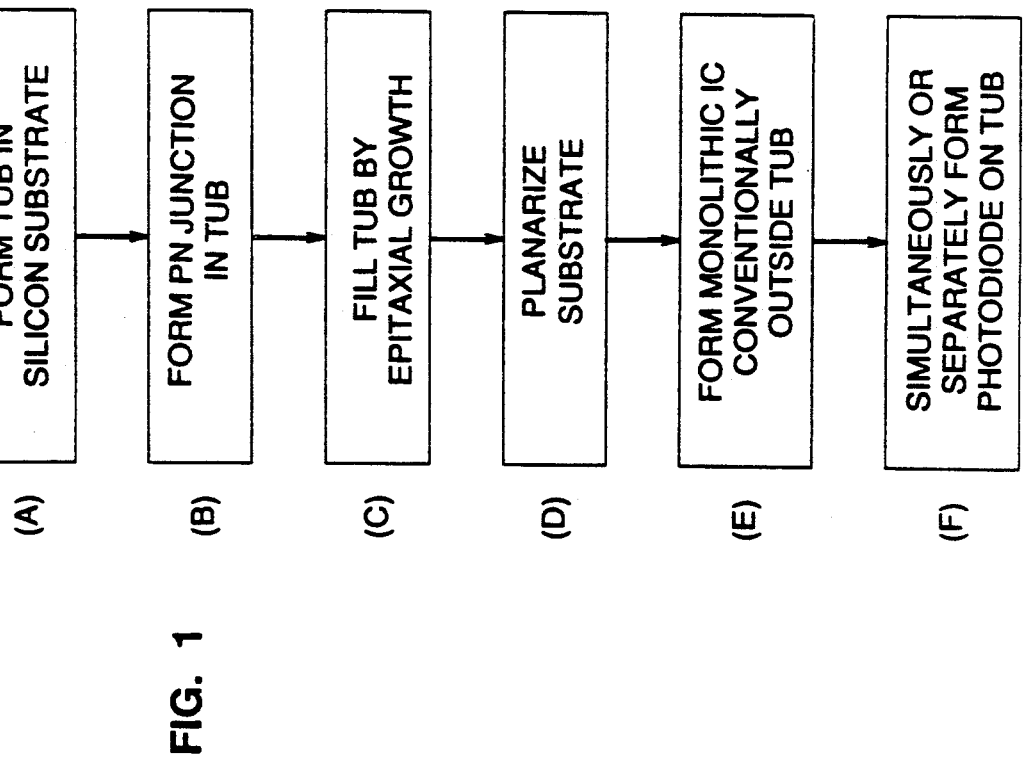
FIG. 1 is a flow diagram showing the process steps used to make a monolithic integrated circuit containing an integrated photodiode in accordance with the invention.

Referring to the drawings, FIG. 1 illustrates the steps in making a monolithically integrated photodiode in accordance with one embodiment of the invention, and FIG. 2 schematically illustrates the structures produced by the successive steps.

FIG. 1A shows the first step which involves forming a recessed tub in a silicon substrate. As preliminary steps, the upper surface of substrate is provided with etched registration marks and then a masking layer of silicon oxide.

A deep tub, in excess of about 20 microns in depth, is formed in the region of the substrate where the integrated photodiode is to be formed. Preferably the tub is formed by etching an opening in the oxide mask to define the periphery of the tub (which is typically rectangular) and then etching the tub in the silicon. Preferably the substrate is (100) oriented silicon with a p-type epitaxial layer on a p+ substrate. A preferred etchant is ethylene-diamine-procatechol (EDP). The EDP etch has been found to produce smooth tub surfaces with sidewalls in the (111) planes of the silicon substrate.

Figure 2A:
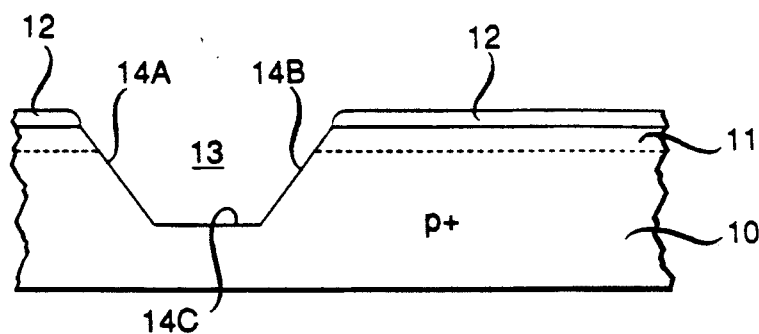
FIGS. 2A-2E show schematic cross sections of a silicon wafer at various steps in the process of FIG. 1.

The result of the tub-forming step is schematically illustrated in FIG. 2A which shows in schematic cross section, the substrate 10, an epitaxial layer 11, the oxide outer layer 12 and tub 13 with smooth side walls 14A and 14B and bottom wall 14C. Preferably the substrate 10 has p+ resistivity in the range from 0.01 to 0.05 ohm-cm. The epitaxial layer 11 has a thickness on the order of 4 microns and p-type conductivity, and the oxide layer 12 conveniently has a thickness of about 3500 angstroms. Typical dimensions for the tub are 100×200 microns (at the substrate surface) with a depth of about 30 microns.

The second step shown in FIG. 1B involves forming a p-n junction around the peripheral surfaces of the tub (side and bottom walls). Conveniently the p-n junction is formed by epitaxially growing thin, doped layers of silicon on the peripheral surfaces. As preliminary steps, the entrenched wafers can be subjected to a combined high temperature pre-bake and HCl—$H_2$ gas etch to reduce native oxide films and to further smooth the bottom and side walls of the tub. A five minute pre-bake and etch at 1025° C. using 0.9 l/m of HCl and 40 l/m of $H_2$ is exemplary.

The p-n junction is then formed as by epitaxially growing doped layers of opposite conductivity type. This growth is preferably effected by lowering the temperature to about 950° C. and exposing the substrate to a $SiH_2Cl_2$—HCl—$H_2$ mixture with a 1:1 ratio of HCl to $SiH_2Cl_2$ at a pressure of about 40 torr. The deposition rate is approximately 0.10 microns per minute. A p-type layer is grown by introducing a gaseous source of p-type impurity into the mixture, and an n-type layer is grown by introducing a gaseous source of n-type impurity.

Figure 2B:
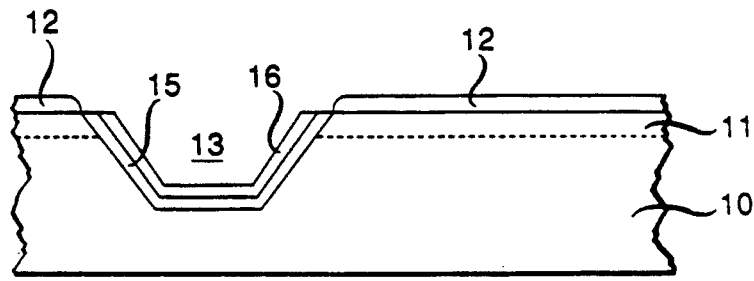

The result of the junction-forming step is shown in FIG. 2B. The p-type layer 15 and the adjoining n-type layer 16 are disposed on the outer surfaces and on the bottom of tub 13. Preferably layer 15 is three microns thick and has a concentration of about $3 \times 10^{15} cm^{-3}$ of p-type impurities. Layer 16 is preferably about 1 micron thick and has a concentration of about $7.5 \times 10^{18} cm^{-3}$ of n-type impurity.

As shown in FIG. 1C, the next step involves filling the tub with intrinsic silicon by selective epitaxial growth. This step is preferably effected by continued exposure of substrate to the $SiH_2Cl_2$—HCl—$H_2$ system without dopants under the conditions described above. A deposition temperature of 950° C. represents a good compromise between selective growth and a reasonably high growth rate in order to minimize total deposition time. The high 1:1 ratio of HCl to $SiH_2Cl_2$ reduces growth rates in larger features but also reduces the density of defects. The intrinsic semiconductor preferably has an dopant concentration of about $1 \times 10^{13} cm^{-3}$.

Figure 2C:
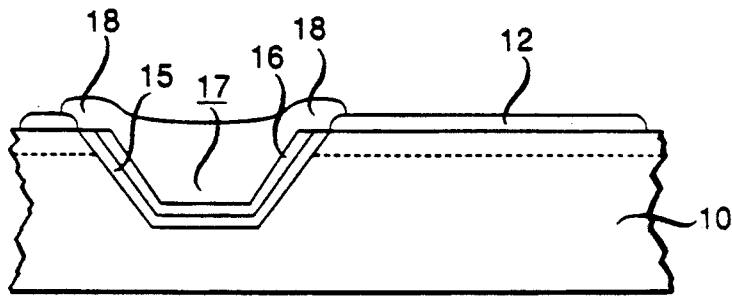

The resulting structure shown in FIG. 2C has the tub filled with a region of intrinsic silicon 17. As shown, an observed feature of this structure for deep tubs is a ridge 18 extending around the tub periphery. The ridge—which is not a desired feature—is believed due to nucleation from the silicon lattice at the edge of the silicon oxide mask. The ridge is typically on the order of 20 microns in height.

Where such ridges are formed, the next step shown in FIG. 1D is to planarize the resulting substrate. This step involves removing surface irregularities—including at least portions of ridge 18—from the substrate. The preferred planarization process is accomplished in two steps. The first step is mechanical abrasion by lapping the substrate. Lapping may be done with 1 micron aluminum oxide particles at 60 rpm for 2-4 minutes on a nonmetallic, fused quartz lap. The second step is to polish the lapped substrate. Polishing may be effected with a polyurethane polymer pad saturated with colloidal silica slurry. The preferred pad is a Suba IV pad marketed by Nalco Chemical Co., Chicago. Ill., and the preferred silica slurry is Nalco 2350 marketed by the same company. Adequate polishing is effected in 1-2 minutes on a conventional polishing machine.

Figure 2D:
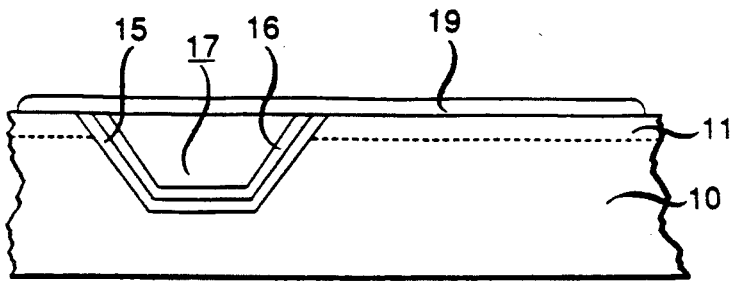

The resulting structure shown in schematic cross section is in FIG. 2D. In essence, the structure comprises substrate 10, a deeply buried p-n junction comprised of layers 15 and 16 of opposite conductivity type, region 17 of intrinsic silicon filling the tub and an outer layer of oxide 19 on a planar surface.

The next two steps shown in FIGS. 1E and 1F involve forming a monolithic integrated circuit by conventional means in the region outside the tub region of intrinsic silicon and, preferably at the same time, forming a photodiode within the tub region. Registration with respect to the tub region is provided by the alignment marks etched into the substrate at the beginning of the process.

Figure 2E:
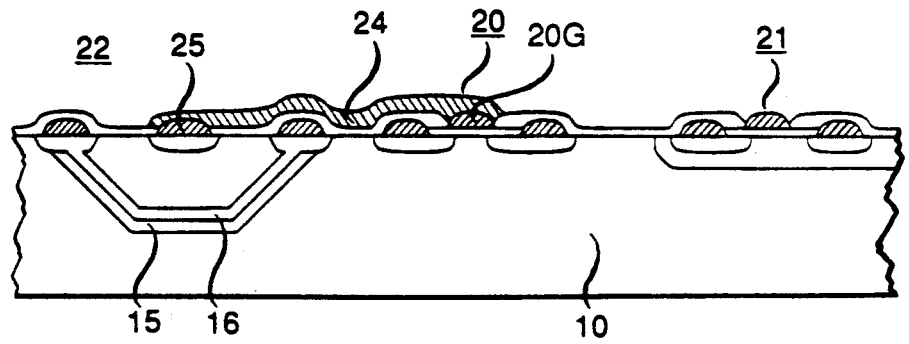

The various components of the monolithic integrated circuit outside the tub periphery are conveniently conventional components formed in the conventional fashion by techniques well known in the art. For purposes of illustration, FIG. 2E shows only two such components, a pair of CMOS insulated gate field effect transistors 20 and 21 formed outside the tub periphery and connected to a photodiode 22 formed within the tub periphery. In particular one of the transistors has its control element (i.e. gate 20G) connected via metal connector 24 to the collecting electrode 25 of photodiode 22 for providing an integrated combination of photodiode and amplifier.

Figure 4:
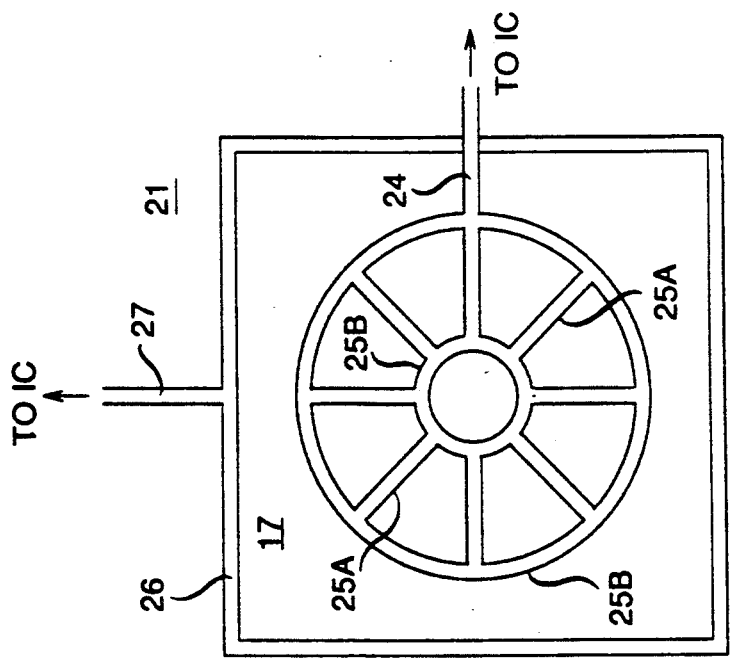
FIG. 4 is a schematic plan view in elevation of the integrated photodiode of FIG. 3. It is to be understood that these drawings are for purposes of illustrating the concepts of the invention and are not to scale.
Figure 3:
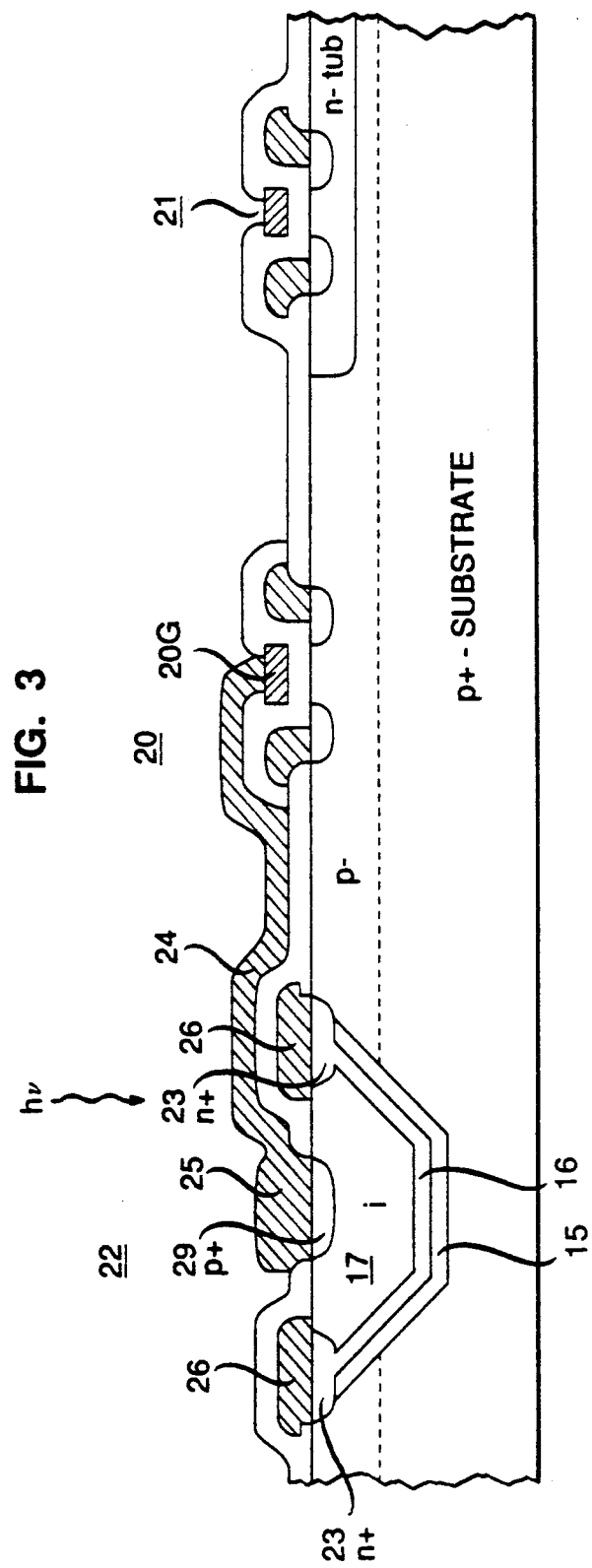
FIG. 3 is an enlarged schematic cross section of a typical monolithic integrated circuit containing an integrated photodiode in accordance with the invention.

The photodiode 22, better shown in FIGS. 3 and 4 can be fabricated within the tub periphery separately or at the same time the monolithic integrated circuit is fabricated. The latter approach is preferable. In either event, using conventional photomasking, deposition and diffusing techniques, contact regions 23, here n+regions, are formed for permitting ohmic contact between electrode 26 and junction layer 16 at the periphery of the tub region. A second contact region 29, here p+, is formed in the interior of the tub region, as by ion implantation, for permitting ohmic contact with a collector electrode 25. The resulting structure acts as a p-i-n photodiode.

It can thus be seen that the photodiode of the invention is monolithically integrated into a substrate of monocrystalline silicon. The photodiode comprises a body of epitaxially grown intrinsic silicon disposed within a tub in the substrate. The body has the shape of an inverted, truncated pyramid with an upper surface coplanar with the upper surface of the substrate and a thickness (altitude) in excess of about 20 microns. An isolation layer in the form of a p-n junction is disposed between the body and the substrate. A peripheral electrode 26 extends around the periphery of the body on the upper surface, and a collecting electrode 25 is disposed within the periphery of the body on the upper surface and spaced from the first electrode. In the preferred structure, the substrate is (100) oriented silicon and the side walls of the body are substantially parallel to the (111) planes of the substrate. The collecting electrode 25 is spaced from the peripheral electrode 26 by a distance preferably in excess of about 20 microns.

The preferred structure of the collector electrode can be better seen by reference to FIG. 4 which is a schematic top plan view of the photodiode in the tub region. As shown in FIG. 4, electrode 26 extends around the periphery of the tub region. Collector electrode 25 is in the form of a grid 25 of radial fingers 25A and concentric circles 25B with open areas between to increase the effective area of charge collection while reducing interference with incident radiation. Preferably the collection electrode grid is spaced away from the periphery of the tub region (and the peripheral electrode 26) with minimum spacing on the order of 20 microns. This minimum spacing is desirable because it has been found by the inventors that most defects in the structure occur near the periphery. Conductive connectors 24 and 27 extend from electrodes 25 and 26 to the integrated circuit. Preferably, the peripheral electrode 26 is a composite layer of conductively doped polysilicon (1000 Angstroms) and aluminum (1 micron). It can have a width of about 5 microns. The collection electrode 25 is composed of similar elements 25A and 25B having widths of about 5 microns. It is to be understood that the details of the photodiode structure are chosen to be compatible with processing and structure of the adjacent monolithic integrated circuit.

In operation, through a bias resistor and connectors 24 and 27 a voltage of approximately 5-10 volts is applied between electrodes 25 and 26 and the photodiode 22 is exposed to short wave radiation of wavelength between 8000 and 9000 angstroms, as from a gallium arsenide laser or LED (not shown). Such radiation, when absorbed in the intrinsic layer 17, creates hole-electron pairs which are separated by the field between electrodes 25 and 26. One component of the generated pairs is collected by electrode 25. The result is that current proportional to the intensity of incident radiation passes through connector 24 to the integrated circuit where it can be amplified by transistor 20 and processed as desired. The junction between layers 15 and 16 isolates photodiode 22 in depth so that the operation of the photodiode does not spuriously affect other delicate components in the integrated circuit.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for making a silicon monolithic integrated circuit including an integral photodiode comprising the steps of:

providing a silicon substrate having a semiconducting (100) oriented silicon surface;

forming in said semiconducting (100) oriented silicon surface a recessed tub having a depth in excess of about 20 microns underlying the region in which said photodiode is to be made, said tub having a peripheral surface including a bottom surface; a plurality of peripheral sidewalls along the 111-axis of the silicon and a peripheral edge, forming a p-n junction over the peripheral surface of said tub including said peripheral sidewalls;

filling said tub region with epitaxially grown silicon;

forming a monolithic integrated circuit on the region of said substrate outside the peripheral edge of said tub; and simultaneously or separately forming a photodiode on the region of said substrate within the peripheral edge of said tub.

2. The method of claim 1 including the step of planarizing the substrate after filling the tub.

3. The method of claim 1 wherein said photodiode is formed by depositing on the surface of said epitaxially grown silicon within said tub region a collection electrode comprising a grid of interconnected elongated conductive regions.

4. The method of claim 3 wherein said collection electrode is spaced from the peripheral edge of said tub region by a spacing in excess of about 20 microns.

* * * * *